(12) United States Patent
Huang et al.

(10) Patent No.: US 11,279,001 B2
(45) Date of Patent: Mar. 22, 2022

(54) METHOD AND APPARATUS FOR MONITORING CHEMICAL MECHANICAL POLISHING PROCESS

(71) Applicant: TAIWAN SEMICONDUCTOR MANUFACTURING CO., LTD., Hsinchu (TW)

(72) Inventors: Chung-Wei Huang, Hsinchu (TW); Ren-Hao Jheng, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 419 days.

(21) Appl. No.: 16/283,554

(22) Filed: Feb. 22, 2019

(65) Prior Publication Data

US 2020/0269382 A1  Aug. 27, 2020

(51) Int. Cl.
| | | |
|---|---|---|
| *B24B 37/005* | (2012.01) | |
| *B24B 49/12* | (2006.01) | |
| *B24B 53/00* | (2006.01) | |
| *B24B 53/017* | (2012.01) | |
| *B24B 57/02* | (2006.01) | |
| *H01L 21/02* | (2006.01) | |
| *H01L 21/67* | (2006.01) | |

(52) U.S. Cl.
CPC ............ *B24B 49/12* (2013.01); *B24B 37/005* (2013.01); *B24B 53/005* (2013.01); *B24B 53/017* (2013.01); *B24B 57/02* (2013.01); *H01L 21/02013* (2013.01); *H01L 21/67092* (2013.01)

(58) Field of Classification Search
CPC ......... B24B 49/12; B24B 49/04; B24B 49/10; B24B 49/18; B24B 57/02; B24B 53/005; B24B 53/017; B24B 37/017; B24B 37/10; B24B 37/107; B24B 37/105; H01L 21/02013; H01L 21/67092; H01L 22/26; H01L 22/12

See application file for complete search history.

(56) References Cited

U.S. PATENT DOCUMENTS

| | | | |
|---|---|---|---|
| 6,628,410 B2* | 9/2003 | Doan | H01L 21/30625 356/630 |
| 8,965,555 B2* | 2/2015 | Fukuda | B24B 53/017 700/164 |
| 10,058,974 B1* | 8/2018 | Chen | B24B 37/042 |
| 2020/0198094 A1* | 6/2020 | Yagi | B24B 37/20 |

* cited by examiner

*Primary Examiner* — Joseph J Hail
*Assistant Examiner* — Arman Milanian
(74) *Attorney, Agent, or Firm* — Maschoff Brennan

(57) ABSTRACT

A method of monitoring a chemical mechanical polishing (CMP) apparatus including an arm configured to swing a polishing component includes performing a CMP process; learning at least two positions of the polishing component during a normal swing motion of the polish component by an optical acceptor and a processing unit to determine a plurality of expected positions of the polish component; analyzing at least one real position of the polishing component at predetermined time points during the CMP process by the optical acceptor and the processing unit; inspecting whether an abnormal event occurs based on the analyzed real position of the polishing component and the expected positions by the processing unit during the CMP process; and determining whether to send an alarm and stop the CMP process based on the inspecting result.

20 Claims, 10 Drawing Sheets

METHOD AND APPARATUS FOR MONITORING CHEMICAL MECHANICAL POLISHING PROCESS

BACKGROUND

Using fabrication technology, several microcircuits can be integrated on a single chip to form an integrated circuit (IC). Formation of interconnects between various regions of an IC circuit is a conventional and necessary step of design and fabrication process. The interconnects are coated with one or more layers, including dielectric layers, in Subsequent steps of the fabrication process. Because the interconnects often protrude from the surface of the substrate, the subsequently coated layers will have an uneven surface. When subjected to a chemical mechanical polishing (CMP) process, the unevenness creates a pattern which can have considerable undesirable effects in the manufactured product. The unevenness in effective pattern density often results in uneven post-polish film thickness.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
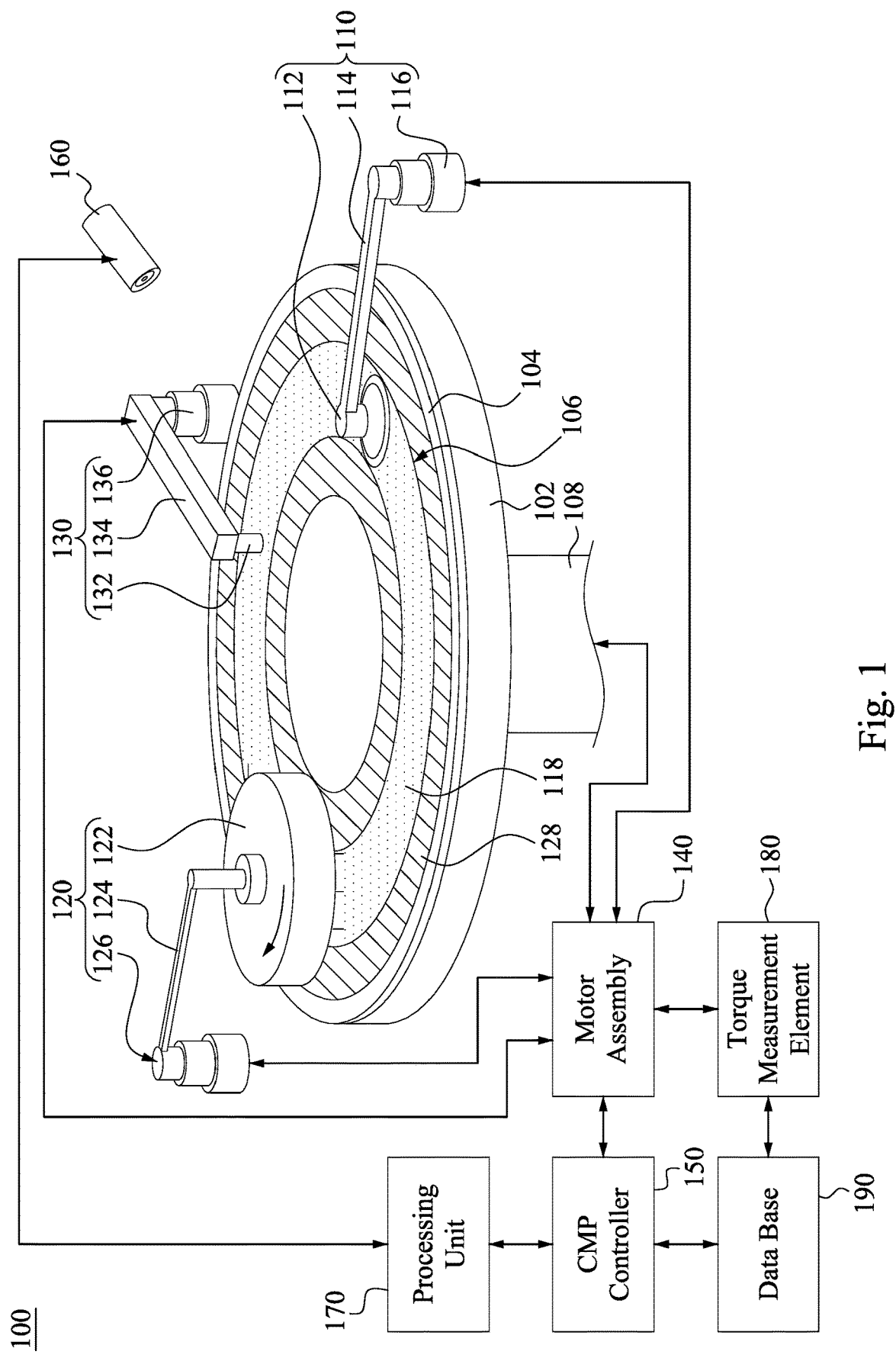
FIG. 1 is a schematic of a CMP apparatus according to some embodiments of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

In conventional CMP process, wafer scratch may not be detected until many more process steps are performed, and then a visual or automated scan of the wafer may reveal these defects. In an example process, after shallow trench isolation (STI) CMP process, a wafer scan is not performed until a layer of silicon nitride or other dielectric layers are formed. This scan step may occur many hours later in the process flow. Wafer scratches that occurred in the STI CMP process are not detected until the first damaged wafer reaches the inspection stage. These wafers may all be as damaged as was the first one that was scratched. Thus, materials and processing time may be wasted on hundreds of wafer that have scratches and may not yield any functioning devices.

Accordingly, in some embodiments, deflection of a transverse arm that engaged with the conditioning disk may be measured, for example, by a strain gauge or by measuring a reflection light. Therefore, deflection of the transverse arm due to a jammed shaft caused by unstable down-force may be detected. In some other embodiments, vibration of a polish head caused by the hard particle lodged between a wafer and the polishing pad may be detected by a vibration sensor. More abnormal conditions may also be detected by the vibration sensor, for example, unsmooth polishing speed, inconsistent slurry caused by the dispenser or other mechanical problem, abnormal slurry or absence of slurry, machine failure in a motor or spindle, etc.

However, deflection and vibration may merely measure the effect exerted in the vertical direction relative to the polishing pad, but fail to indicate the effect exerted horizontally. For example, if the motions of the transverse arms that engaged with the conditioning disk or the polish head stopped, while the rotation and the down-force of the conditioning disk or the polish head can still maintain the polishing rate, the vibration or deflection of the traverse arms may vary in a reasonable range but not exceed predetermined threshold. Therefore, the CMP process may be performed continuously without sending an alarm or without applying any adjustments to the CMP parameters. As a result, the damage or influence caused by the abnormal motion of the transverse arms may be neglected. Accordingly, the abnormal motion or malfunction of the transverse arms that engage with polish head, the slurry supply, or the conditioning disk cannot be detected through the deflection or vibration signal.

In some other embodiments, torque exerted by a motor assembly may be measured by a torque measurement element. Since the torque is proportional to the amount of friction between the surfaces of the conditioning disk and the polishing pad, surface conditions of the conditioning disk or the polishing pad may be determined from the measured torque by a surface condition analyzer. A CMP controller may change the CMP process parameters to adjust the down-force applied to the conditioning disk or the polish head to make the torque measured recover to an expected value, even when the motions of the transverse arms stopped abnormally. Therefore, even though some abnormal torque may be caused by abnormal motion or malfunction of the transverse arm, misjudgments may still occur due to this indirect detecting method. As a result, the adjustments to the CMP process parameter may not directly eliminate the effect on the surface condition caused by the abnormal motions of the conditioning disk, the polish pad, or the polish head.

As described above, conventional CMP techniques lack real-time feedback to adequately account for motions (e.g., positions or velocity during a swing motion) of the polishing head, the slurry supply, and the conditioning disk. Therefore, the damage or effect on the wafer profile may be neglected or be adjusted incorrectly. For example, an abnormally stopped conditioning disk may cause a certain range of the polishing surface to be overly conditioned, while cause the rest of the polishing surface to be insufficiently conditioned. As a result, quality and uniformity of the polished surface may degrade. Thus, it is imperative to be able to directly monitor the positions of the polishing heads, the slurry supply, and the conditioning disks such that damage of the wafer can be avoided instantly.

Embodiments of the present disclosure which are now described in detail provide methods and apparatus for performing chemical mechanical polishing while detecting abnormal positions of the polish head, the conditioning disk, and the slurry supply caused by abnormal motion or malfunction of the CMP apparatus. An alarm or message signal can be sent, and the CMP process can be stopped automatically. In this manner, damages of the wafers can be remedied, or the processing can be stopped to save materials and time that would have otherwise been spent on processing a wafer that may not yield completed devices. The embodiments provide monitoring of a CMP process which avoids continuing damage to numerous wafers in contrast to the conventional methods.

FIG. 1 is a schematic of a CMP apparatus 100 according to some embodiments of the present disclosure. The CMP apparatus 100 includes a rotating platen 102, a polishing pad 104, a conditioner 110, a wafer carrier 120, a slurry system 130, a motor assembly 140, a CMP controller 150, and a torque measurement element 180. The polishing pad 104 is mounted on the rotating platen 102 and has a polishing surface 106. The rotating platen 102 is electrically connected to the motor assembly 140 through a driving shaft 108. The platen 102 and the polishing pad 104 are configured to be rotated in a circumferential direction by the motor assembly 140, which is controlled by the CMP controller 150.

The conditioner 110 includes a conditioning disk 112 which can be pivoted via an arm 114. The arm 114 is electrically connected to the motor assembly 140 through a shaft 116. The arm 114 is driven by the shaft 116 to move, for example, in a swing motion during the CMP process. Therefore, the conditioning disk 112 travels along the swing motion to condition different portions of the polishing surface 106. The conditioning disk 112 may be configured to rotate about its own axis so as to restore asperities to the polishing surface 106 as the CMP process makes the polishing surface 106 be smoother. That is, in order to retain the material removal qualities of the polishing pad 104, the conditioning disk 112 is used to maintain roughness on the polishing surface 106 that would otherwise be lost during the CMP process. The conditioning disk 112 carries an abrasive pad that may include, for example, diamond abrasive.

The wafer carrier 120 includes a polish head 122 for mounting a wafer, usually by means of a vacuum. The wafer is mounted in the polish head 122 such that the active surface is oriented to face the polishing surface 106. The polish head 122 may also be pivoted via an arm 124. The arm 124 is electrically connected to the motor assembly 140 through a shaft 126. In some embodiments, the arm 124 may also be driven by the shaft 126 to move in a swing motion during the CMP process. The polish head 122 may be configured to rotate about its own axis so as to make the active surface of the wafer been polished during the CMP process.

The slurry system 130 includes a slurry supply 132 which can be pivoted via an arm 134. The arm 134 is electrically connected to the motor assembly 140 through a shaft 136. In some embodiments, the arm 134 may also be driven by the shaft 136 to move in a swing motion during the CMP process. The slurry system 130 can provide slurry which is typically an abrasive compound and a fluid such as deionized water, or a liquid cleaner such as KOH, onto the polishing surface 106 of the polishing pad 104 before wafer planarization occurs.

During the CMP processing, the polishing pad 104 is rotated by the motor assembly 140. The slurry is dispensed by the slurry system 130 onto the polishing surface 106. As polishing pad 104 rotates, the conditioning disk 112 is rotated about its own disk axis and is driven to swing horizontally above the polishing surface 106 such that the conditioning disk 112 can condition the entire polishing surface 106 of the polishing pad 104. That is, in this embodiment, the conditioning disk 112 iteratively conditions the inner portions and the outer portions of the polishing surface 106. The motor assembly 140 also rotates a wafer housed within the wafer carrier 120 through the arm 124 and the shaft 126. A down-force is controlled by the CMP controller 150 to move the active surface of the water onto the polishing surface 106. In this configuration, conditioning disk 106 scratches or roughs up the polishing surface 106 of the polishing pad 104 continuously during CMP process to help ensure consistent uniform planarization. The combination of motions of the conditioner 110, the wafer carrier 120, and the slurry system 130 planarizes the active surface of the wafer until an endpoint for the CMP process is reached.

As an example for describing the influence caused by abnormal motion of the conditioning disk 112, as shown in FIG. 1, the range 118 represents the portion of the polishing surface 106 been scratched or roughed up more if the conditioning disk 112 stops at fixed location. The range 128 which partially overlapped with range 118 represents the portion of the polishing pad 106 wears out during the polishing. The range 128 may be wider in some embodiments when the polished head 122 is driven to swing. In this embodiment, the configurations of the conditioning disk 112 and the polish head 122 may not result in deviations to torque exerted by the motor assembly 140, vibration, or deflection that are large enough for triggering an alarm. In some other embodiments, the deviations to the torque, vibration, or deflection may be adjusted such that the CMP processing may be performed continuously without sending an alarm or a message. Therefore, in this embodiment, misjudgments or neglected abnormal events may occur due to the lack of direct monitoring of the positions of the conditioning disk 112 and the polish head 122. Particularly, non-uniform conditioning will affect the quality of the polishing. For example, the uniformity of the polished surface may degrade, which results in low efficiency for some subsequent processing that is sensitive to the surface roughness.

To avoid misjudgments or neglected abnormal events of conventional CMP apparatus as described above, the CMP apparatus 100 includes an optical acceptor 160 configured to continuously acquire images of CMP apparatus 100 during the CMP process. The images acquired by the optical acceptor 160 are processed by the processing unit 170 to extract the information corresponding to the positions of the conditioning disk 112, the polish head 122, or the slurry supply 132. A database 190 may further be used to store data for process research and development to optimize the CMP process performance. An alarm may be sent, and the CMP process may be stopped by the controller 150 based on an inspection result from the processing unit 170.

Figure 2:
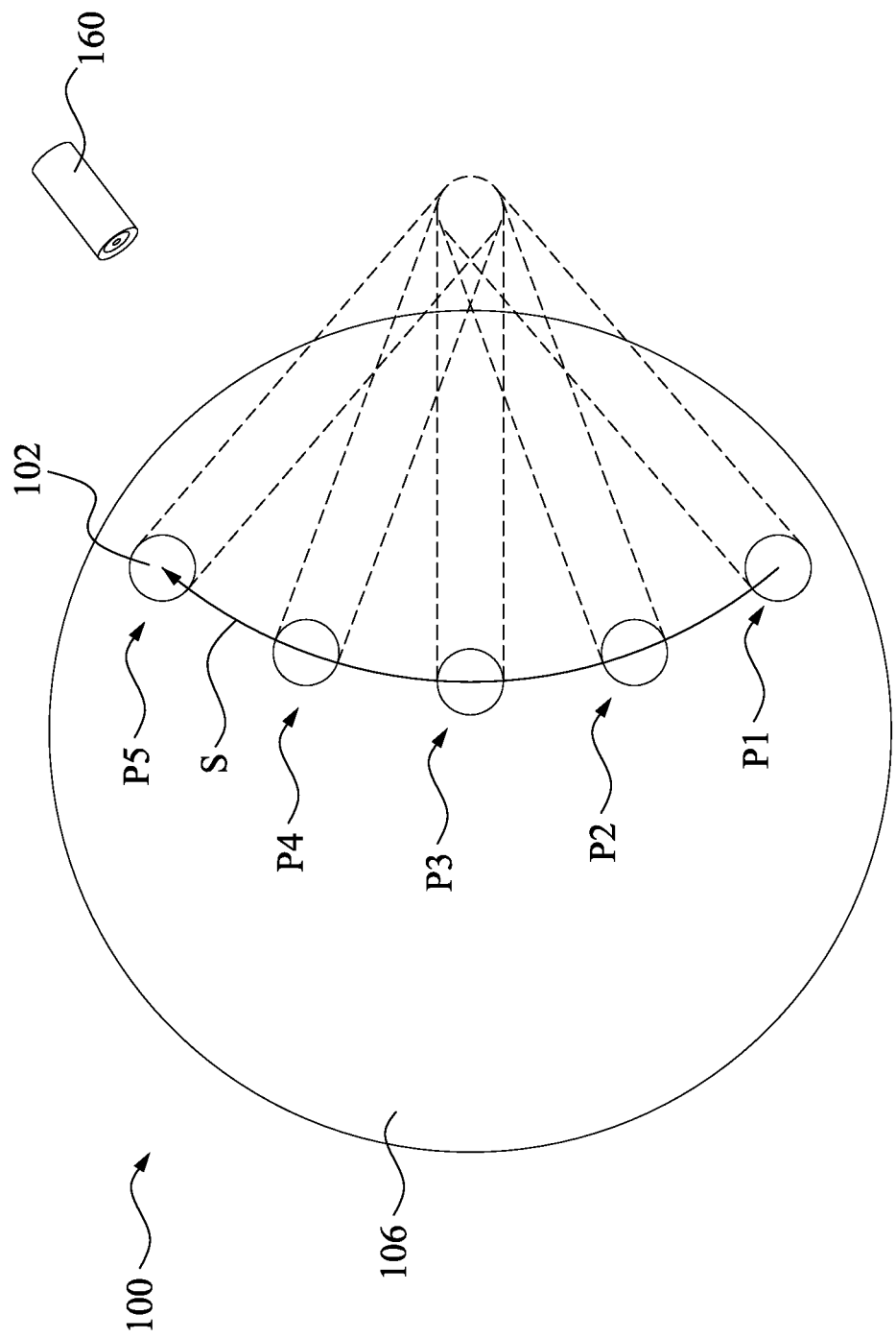
FIG. 2 is a top view of a schematic illustrating a swing motion of a conditioning disk according to some embodiments of the present disclosure.

FIG. 2 is a top view of a schematic illustrating a swing motion of a conditioning disk 102 according to some embodiments of the present disclosure. During a CMP process, images of the CMP apparatus 100 are continuously acquired by the optical acceptor 160 at each predetermined time points during a normal operation. Although merely the conditioning disk 102 is shown in FIG. 2, the slurry supply 132 (see FIG. 1) and the polish head 122 (see FIG. 1) may also be acquired by the same optical acceptor 160 or by other optical acceptors 160.

In this embodiment, the conditioning disk 102 is moved in a normal swing motion. That is, the CMP process are performed with the CMP parameters been optimized by the CMP controller 150 (see FIG. 1). As shown in FIG. 2, P1-P5 respectively represent the position of the conditioning disk 112 above the polishing surface 106 at time points t1-t5 during a normal swing motion period S (the period for the conditioning disk 112 moves from P1 to P5). By processing the images acquired at time points t1-t5, positions that indicate where the conditioning disk 112 should be located after time point t5 during the normal swing motion can be determined and are considered as expected positions as will be described below. It is noted that positions P1-P5 are presented simultaneously in FIG. 2 merely for demonstrating relative positions.

The predetermined time points may correspond to a frame rate of the optical acceptor 160. The frame rate of the optical acceptor 160 may depend on, for example, the speed of the arm 114 of the conditioner 110, the range of the swing motion of the arm 114, the length of the arm 114, or the size of the conditioning disk 112, etc. In the embodiment illustrated by FIG. 2, the frame rate is selected automatically by the processing unit 170 such that five separate positions P1-P5 of the conditioning disk 112 during the normal swing motion period S are determined and used in the subsequent processing. In some embodiment, frame rate may be selected by the processing unit 170 based on the stored data in the database 190 and/or the images acquired during the specific CMP process. In some other embodiments, more or less than five positions may be determined during the normal swing motion period S. In other words, higher or lower frame rate can be selected, which results in narrower or wider separations between each two positions determined from the images.

Figure 3:
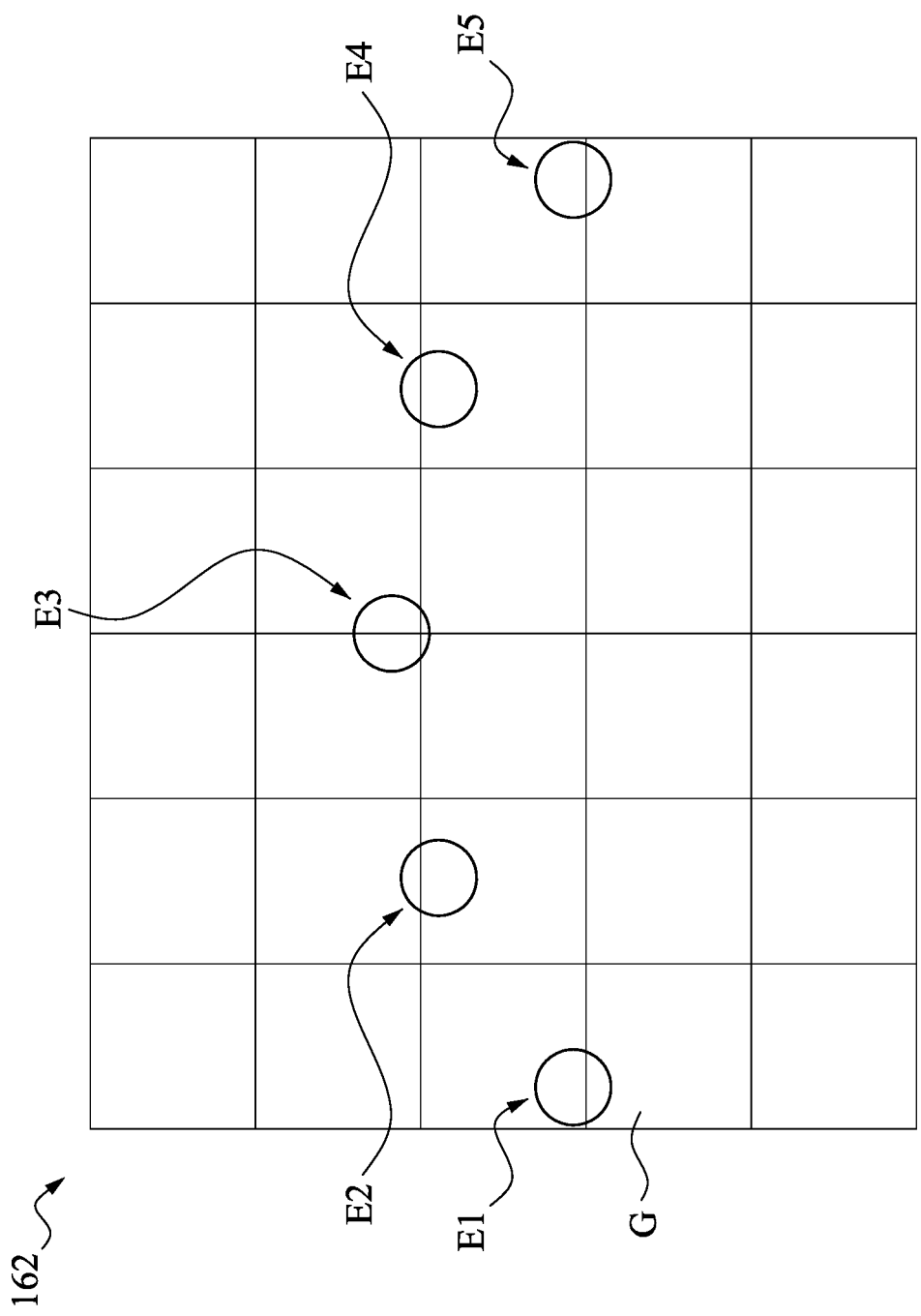
FIG. 3 is a schematic illustrating expected positions determined from images of the conditioning disk as shown in FIG. 2.

FIG. 3 is a schematic illustrating expected positions E1-E5 determined from images of the conditioning disk 112 as shown in FIG. 2. In some embodiments, the frame 162 represents the images acquired by the optical acceptor 160 which is used to monitor the conditioner 110, the wafer carrier 120, the slurry system 130, or the combination thereof. In this embodiment, positions P1-P5 of the conditioning disk 112 can be determined by the processing unit 170 from five images respectively acquired at time points t1-t5 during a normal swing motion period S as described in FIG. 2. In some embodiments, position of the conditioning disk may be indicated by the grids G of the frame 162 that contains the feature of the conditioning disk 112, or the coordinates of the conditioning disk 112 in subsequent images. Once the positions P1-P5 are determined, expected positions E1-E5 can be determined and set as a reference for monitoring abnormal CMP process events. In other words, positions of the conditioning disk 112 at time points t6, t7, t8 the endpoint of the CMP process can be determined.

Particularly, in the embodiment shown in FIG. 3, the positions of the conditioning disk 112 at subsequent time point t6 may correspond to the expected position E4, the positions of the conditioning disk 112 at subsequent time point t7 may correspond to the expected position E3. Similarly, the positions of the conditioning disk 112 at subsequent time points t8, t9, and t10 may respectively correspond to the expected position E2, E1, and E2.

Accordingly, expected positions of the conditioning disk 112, the polish head 122, or the slurry supply 132 at time points t6, t7, t8 . . . till the endpoint of the CMP process may all be determined and set as references for monitoring abnormal CMP process events. That is, positions of the conditioning disk 112, the polishing head 122, and the slurry supply 132 during each iterative swing motions (e.g. move back and forth between P1 and P5) can be monitored by at least one optical acceptor 160 and the processing unit 170 during a CMP process.

Figure 4:
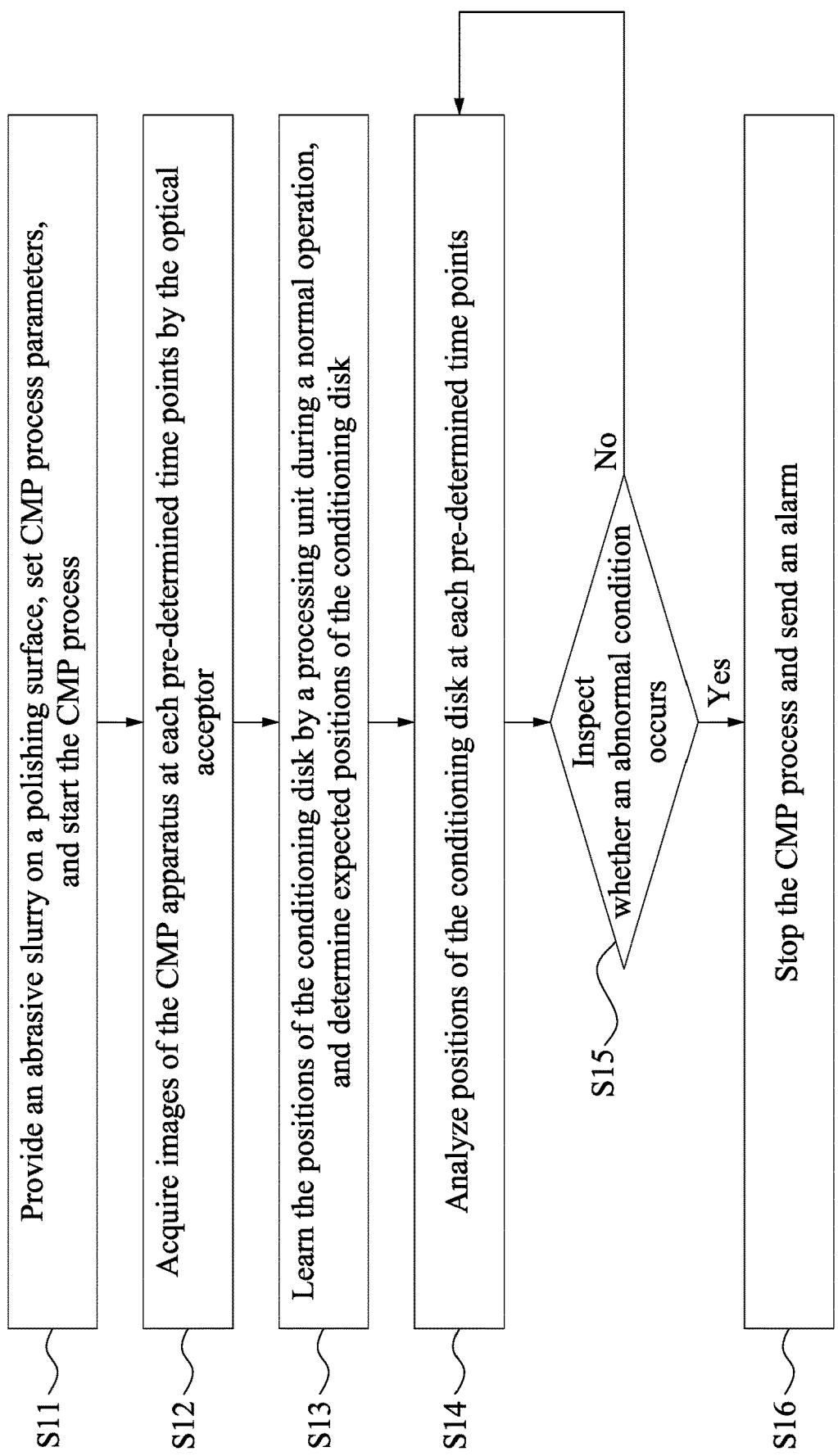
FIG. 4 is a flow chart of a method of monitoring the CMP process according to some embodiments of the present disclosure.

FIG. 4 is a flow chart of a method of monitoring the CMP process according to some embodiments of the present disclosure. While this method and other methods disclosed herein may be illustrated and/or described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases.

As shown in FIG. 4, the method starts at step S11 when CMP process parameters are set for a CMP apparatus. The CMP process parameters may include, but not limited to: a polish time for which wafers are to be polished, a down-force to be applied to the polish head, a down-force to be applied to the conditioning surface, an angular velocity of the polishing pad, the wafer carrier, or the conditioning disk, a slurry composition or a slurry temperature, and swing speeds for the arms 114, 124, 134, etc. A wafer is mounted on the wafer carrier 120 such that the active surface of the wafer may be in contact with the polishing surface 106 of the polish pad 104. The wafer typically includes a film of, for example, dielectric layer deposited on the active surface of the wafer. The slurry system 130 provides abrasive slurry on the polishing surface 106 of the polish pad 104. The conditioning disk 112 is placed to be in frictional engagement with the polishing surface 106 to perform conditioning. Thereafter, the CMP process starts while using the CMP process parameters optimized by the CMP controller 150 such that a normal operation is performed.

In step S12, the optical acceptor 160 acquires images of the CMP apparatus at each predetermined time points. For simplicity and clarity, in this embodiment, only the conditioning disk 112 is monitored. In some embodiment, the wafer carrier 122, the slurry supply 132, the conditioning disk 112, or the combination thereof can be monitored at the same time by one or more optical acceptor 160.

In step S13, the processing unit 170 automatically learns the positions of the conditioning disk 112 during the normal operation, while the optical acceptor 160 continuously acquires the images of the CMP apparatus. In some embodiments as shown in FIG. 3, the positions P1-P5 of the conditioning disk 112 may be automatically learned by the processing unit 170 through pattern recognition method. Thereafter, expected positions E1-E5 of the conditioning disk 112 at time points, t6, t7, and t8 . . . till the end point of the CMP process can be determined based on the positions P1-P5 learned from the images acquired respectively at time points, t1, t2, t3, t4, and t5 in step S12.

Figure 5:
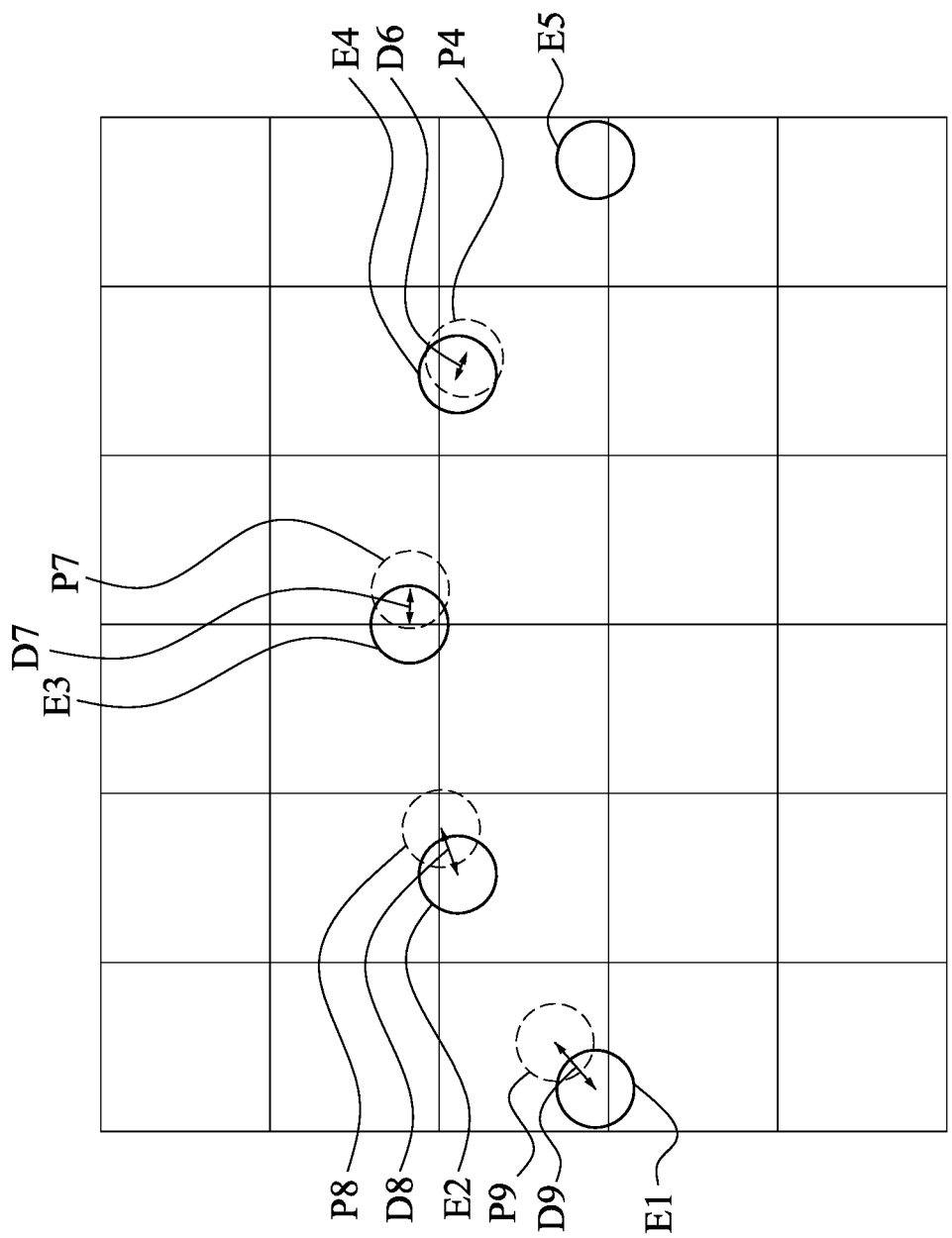
FIG. 5 is a schematic illustrating expected positions and real positions according to some embodiments of the present disclosure.

FIG. 5 is a schematic illustrating expected positions E1-E5 and real positions P6-P9 according to some embodiments of the present disclosure. In step S14, after expected positions E1-E5 of the conditioning disk 112 are determined in step S13, the processing unit 170 automatically analyzed the positions of the conditioning disk 112 from each images through image process, while the optical acceptor 160 continuously acquires the images of the CMP apparatus simultaneously. For example, as shown in FIG. 5, the expected positions E4, E3, E2, and E1 respectively represent where the conditioning disk 112 should be located at time points t6, t7, t8, and t9 based on the learning process in step S13, while P6, P7, P8, and P9 represent the real positions of the conditioning disk 112 at time points t6-t9.

In this embodiment, a deviation D6 exists between the real position P6 and the expected position E4. Similarly, deviations D7-D9 exist respectively between the positions P7-P9 and the expected positions E3-E1. Data of those positions and deviations may be stored onto the database 190, for example, in a memory device, hard disk drive, EEPROM or flash, commodity memory or the like coupled to the processing unit 170 and the controller 150 for alternative processing, as will be described later in other embodiments.

In step S15, after the real position P6 is analyzed, a comparison between the real positions P6 and the expected position E4 is automatically performed by the processing unit 170 before reaching the time point t7. That is, the processing unit 170 may inspect whether the deviation D6 exceeds a predetermined threshold. The predetermined threshold may be automatically retrieved from old data stored in the database 190 or determined based on the images acquired by the optical acceptor 160. The data of those real positions P6, P7 . . . , and deviations D6, D7 . . . may also be stored in the database 190 to update the analysis results.

In step S16, if the deviation D6 exceeds the predetermined threshold, an alarm is sent and the CMP process is automatically stopped. However, if the deviation D6 does not exceed the predetermined threshold, the method returns to steps S14 and repeats step S14-S15 until the end point of the CMP process is reached. As an example, when the method returns to step S14 at time point t7, the real position P7 is determined, and deviation D7 is inspected in step S15. The analyzing process in step S14 and the inspecting process and step S15 are substantially the same for the subsequent positions and deviations until the method ends at step S16 or until the end point of the CMP process is reached.

Figure 6:
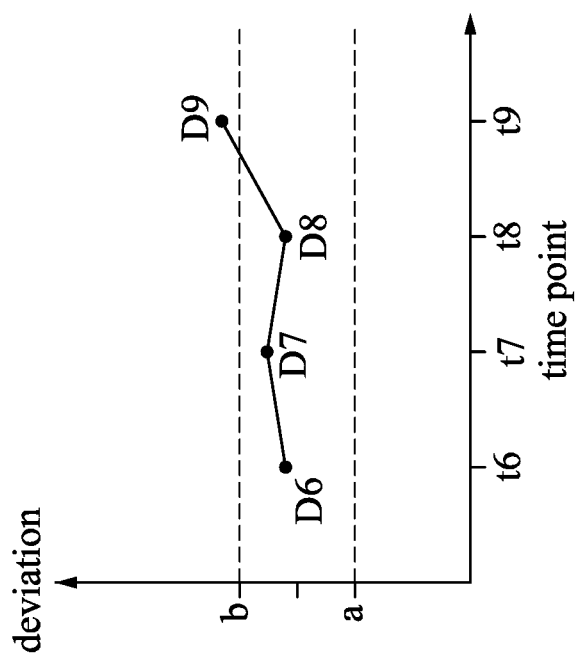
FIG. 6 is a plot of the deviations between expected positions and real positions illustrated in FIG. 5.

FIG. 6 is a plot of the deviations between expected positions E1-E5 and real positions P6-P9 illustrated in FIG. 5. As shown in FIG. 6, the deviation D6, D7, D8 are located within the predetermined threshold a and threshold b, while the deviation D9 exceeds the predetermined threshold b. Therefore, an alarm is sent and the CMP process is automatically stopped right after time point t9. Thereafter, the damage on the wafer profile is inspected and the CMP apparatus is tested. In some cases, the damage may be remediated to continue the CMP processing. If the problem cannot be solved for the particular wafer in the current CMP process, the wafer can be removed from further processing to save time and materials that would be otherwise wasted. In some embodiments, the motor assembly 140, the arms 112, 122, 132, and the shaft 116, 126, 136, etc. may be tested or repaired if needed until the CMP apparatus is ready to polish another wafer. In some embodiments, for example, the threshold may be determined by comparing the overlapping area of the images corresponding to the conditioning disk 112, or by comparing the coordinates determined from the images automatically by the processing unit 170.

In some alternative embodiments, only positions P1 and P5 are learned as an initial position or a final position of the normal swing motion period S in step S13. That is, expected positions E1 and E5 are determined and set as a reference for monitoring abnormal CMP process events. In this embodiment, real positions P6-P9 of the conditioning disk 122 analyzed in step S14 will be compared with both the expected position E1 and E5 to inspect whether the real position P6-P9 are located between the expected position E1 and E5.

In some alternative embodiments, each of two consequent positions, for example, real positions P6 and P7 will be compared to inspect whether an expected coordinate difference exists or whether the area of the images are not overlap with each other.

In some embodiments, the analysis results according to data stored in the database 190 may help to determine the inspecting method describe above by considering both the precision of monitoring and time consuming. For example, by analyzing the stored data, the frame rate of the optical acceptor 160 may be optimized to be higher or lower, or the inspecting method may be changed for accommodating the method to different CMP apparatus.

Figure 7:
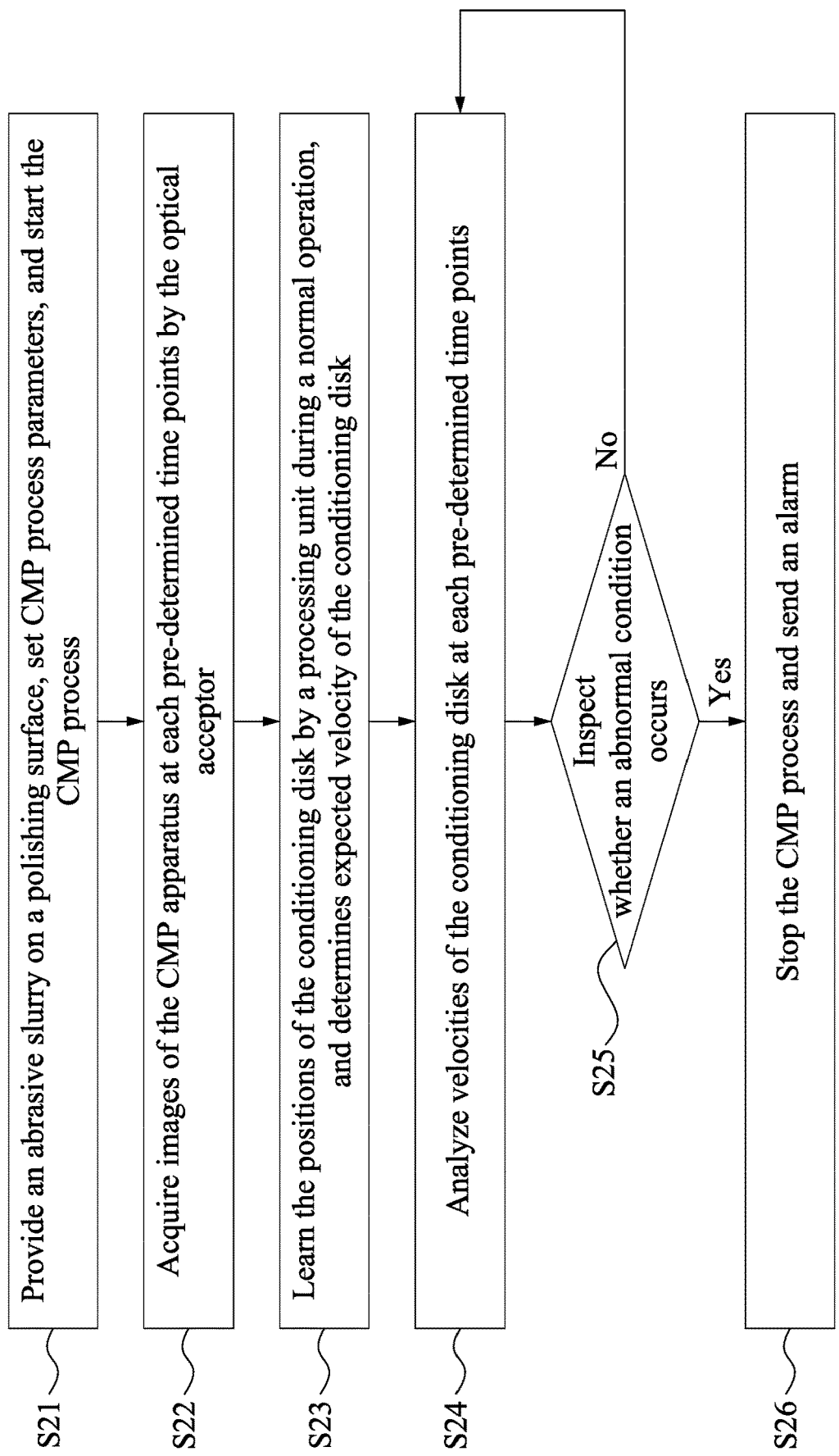
FIG. 7 is a flow chart of another method of monitoring the CMP process according to some embodiments of the present disclosure.

FIG. 7 is a flow chart of another method of monitoring the CMP process according to some embodiments of the present disclosure. Steps S21-S23 and step S26 are similar to step S11-S13 and step S16 as described in FIG. 4. In step S24, after expected positions E1-E5 of the conditioning disk 112 are determined, the processing unit 170 may further analyze an expected velocity (or speed) of the swing motion from expected positions E1-E5. Data of those velocities may be stored onto the database 190. In some embodiments, in step S25, the time interval for images of the conditioning disk 112 overlapping with the expected position E3 twice and a corresponding distance may be analyzed to determine the velocity of the swing motion period S.

Figure 8:
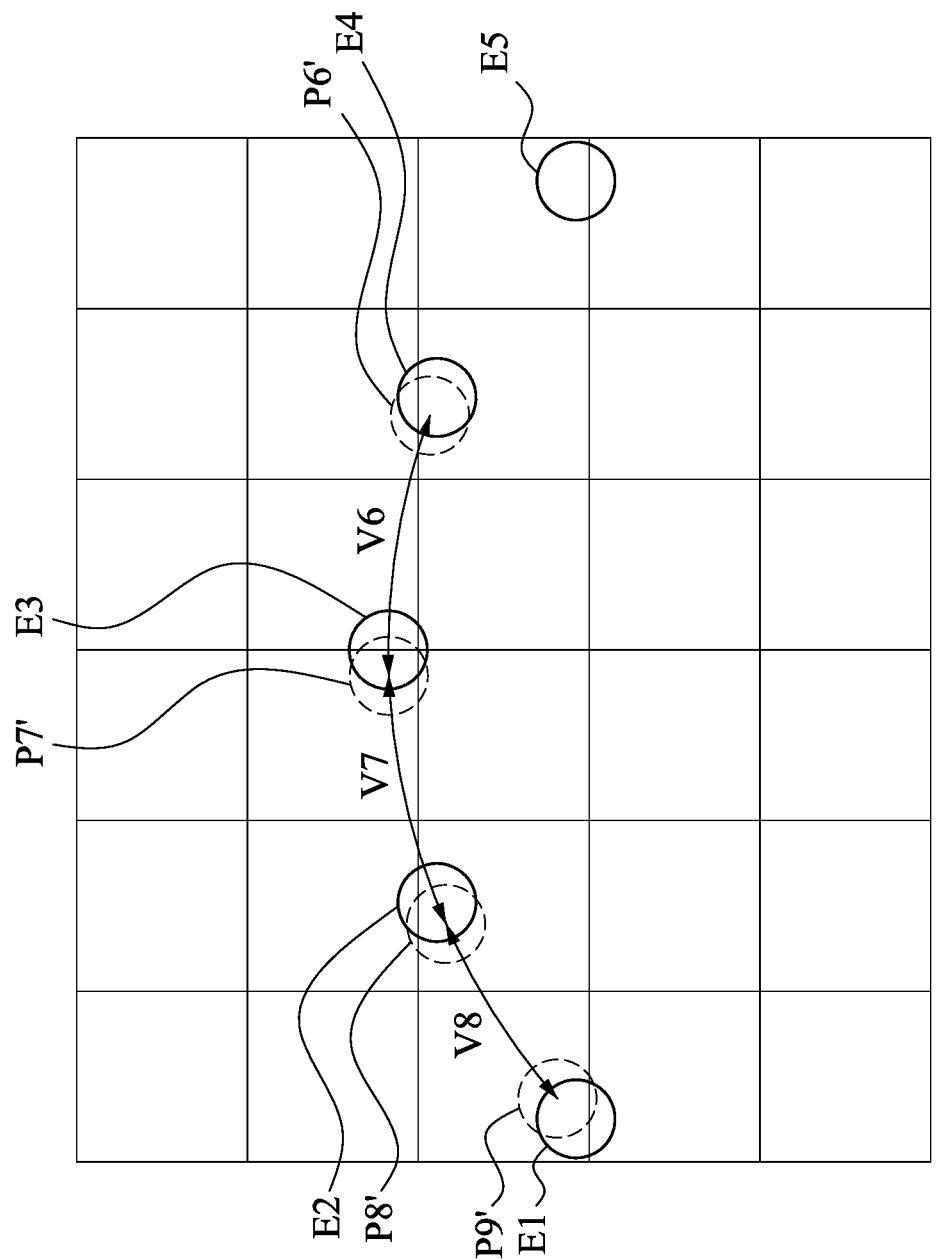
FIG. 8 is a schematic illustrating expected positions and real positions according to some embodiments of the present disclosure.

FIG. 8 is a schematic illustrating expected positions E1-E5 and real positions P6-P9 according to some embodiments of the present disclosure. In some embodiments, in step S25, real velocities V6, V7, and V8 can be analyzed from the real positions P6'-P9'. A comparison between the real velocity V6-V8 of each two consequent positions of P6-P9 and the expected velocity is automatically performed by the processing unit 170. That is, the processing unit 170 may inspect whether the deviation of the real velocities V6-V8 exceeds a predetermined threshold.

Figure 9:
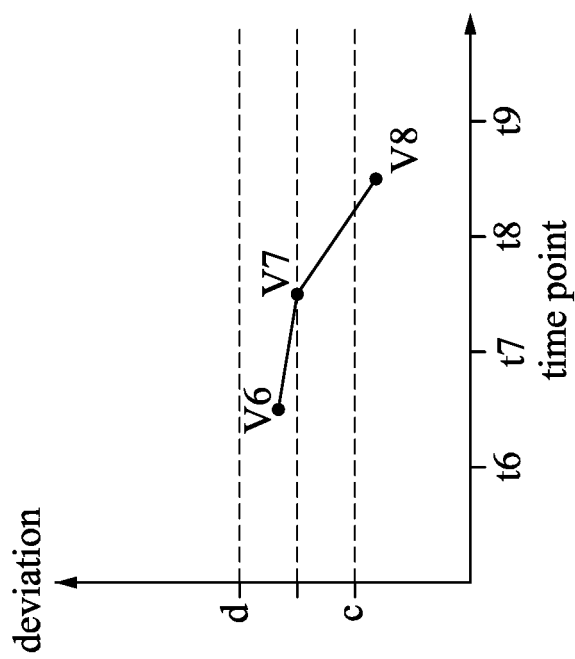
FIG. 9 is a plot of the velocities between the real positions illustrated in FIG. 8.

FIG. 9 is a plot of the deviations between expected velocity and real velocities V6-V8 illustrated in FIG. 8. In this embodiment, the real velocities V6 and V7 are located within the predetermined threshold c and threshold d, while the real velocity V8 exceeds the predetermined threshold c. Therefore, an alarm is sent and the CMP process is automatically stopped.

In some embodiments, the analyzing process in step S24 and the inspecting process in step S25 may be combined with those in step S14 and step S15 as described in FIG. 4 to improve the inspection precision. For example, in the embodiment shown in FIG. 8 and FIG. 9, the deviation between expected position E2 and the real position P8' does not exceed the predetermined threshold, and the deviation between expected position E1 and the real position P9' does not exceed the predetermined threshold. However, the velocity V8 may still exceeds the predetermined threshold T4. Therefore, the database 190 may analyze those stored data and the recorded abnormal events to optimize the inspecting method to improve the monitor efficiency and inspection precision.

Figure 10:
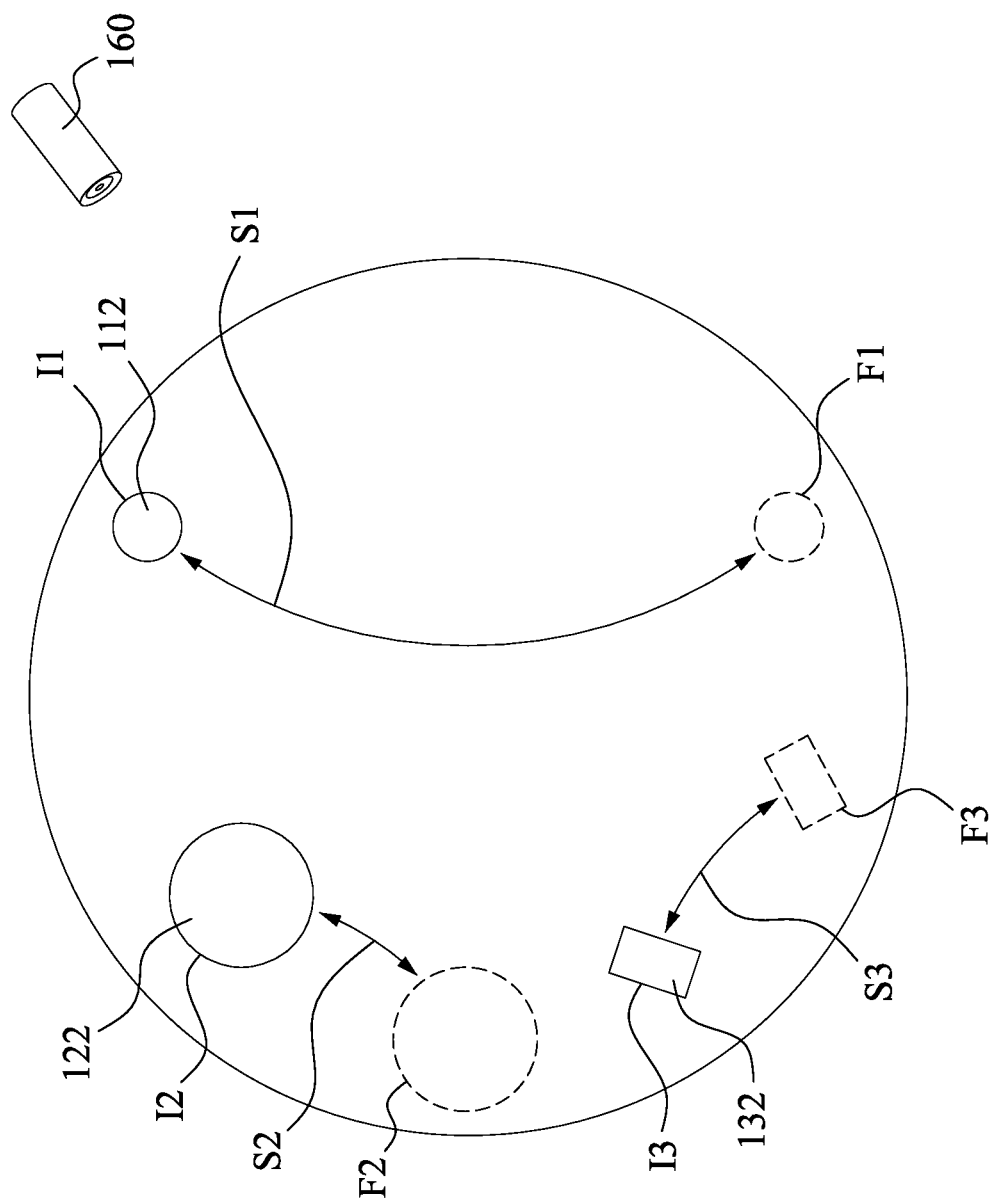
FIG. 10 is a top view of a schematic illustrating a swing motion of a conditioning disk, a polish head, and a slurry supply according to some embodiments of the present disclosure.

FIG. 10 is a top view of a schematic illustrating a swing motion of a conditioning disk 112, a polish head 122, and a slurry supply 132 according to some embodiments of the present disclosure. In this embodiments, positions of the conditioning disk 112, the polish head 122, and the slurry supply 132 can be simultaneously determined by the processing unit 170 from images respectively acquired at different time points during a normal swing motion period similar to those described in FIG. 2.

In the embodiments shown in FIG. 10, initial positions I1, I2, I3 and final positions F1, F2, F3 of the conditioning disk 112, the polish head 122, and the slurry supply 132 are respectively determined. In some other embodiments, more than two positions during a normal swing motion period may be determined as described in FIG. 2. In some embodiment, the frequencies of the normal swing motion S1, S2, S3 may be different. In other words, number of positions during the normal swing motion period S1, S2, S3 may be different. However, as long as the expected positions of the conditioning disk 112, the polish head 122, and the slurry supply 132 can be determined at each predetermined time points, the swing motion of the conditioning disk 112, the polish head 122, and the slurry supply 132 can be monitored by the same optical acceptor 106 and analyzed by the processing unit 170 at the same time.

As described above, the monitoring method of the present disclosure may directly monitor positions of the conditioning disk, the slurry supply, and the polish head to inspect abnormal operation or malfunction of the CMP apparatus instantly. Therefore, damage to the wafer profile may be minimized to improve the uniformity of the wafer surface and the efficiency of the subsequent process. Furthermore, the neglected abnormal events or misjudgments happened in conventional CMP monitoring method can be overcome so as to avoid material and time wasting and improve the quality of the CMP process. Accordingly, the yield of the semiconductor device can be increased and the performance of the semiconductor device can be improved.

According to some embodiments of the present disclosure, a method of monitoring a chemical mechanical polishing (CMP) apparatus including an arm configured to swing a polishing component includes performing a CMP process; learning at least two positions of the polishing component during a normal swing motion of the polish component by an optical acceptor and a processing unit to determine a plurality of expected positions of the polish component; analyzing at least one real position of the polishing component at predetermined time points during the CMP process by the optical acceptor and the processing unit; inspecting whether an abnormal event occurs based on the analyzed real position of the polishing component and the expected positions by the processing unit during the CMP process; and determining whether to send an alarm and stop the CMP process based on the inspecting result.

According to some embodiments of the present disclosure, a method of monitoring a chemical mechanical polishing (CMP) apparatus including an arm configured to swing a polishing component includes performing a CMP process; learning a plurality of positions of the polishing component during a normal swing motion of the polish component by an optical acceptor and a processing unit to determine an expected velocity of the normal swing motion of the polish component; analyzing a real velocity of the swing motion of the polishing component by the optical acceptor and the processing unit during the CMP process; inspecting whether an abnormal event occurs based on the analyzed real velocity and the expected velocity of the swing motion of the polishing component by the processing unit during the CMP process; and determining whether to send an alarm and stop the CMP process based on the inspecting result.

According to some embodiments of the present disclosure, a chemical mechanical polishing (CMP) apparatus includes a polishing pad having a polishing surface, a wafer carrier configured to position a surface of a wafer in contact with the polishing surface during polishing, a slurry supply for dispensing slurry to the polish pad, a conditioner having a conditioning disk in frictional engagement with the polishing surface during a CMP process, an optical acceptor configured to acquire an image of the CMP apparatus, and a processing unit configured to inspect whether an abnormal event occurs from the images acquired by the optical acceptor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of monitoring a chemical mechanical polishing (CMP) apparatus, wherein the CMP apparatus comprises an arm configured to swing a polishing component, the method comprising:

performing a CMP process;

learning at least two positions of the polishing component during a normal swing motion of the polish component by an optical acceptor and a processing unit to determine a plurality of expected positions of the polish component;

analyzing at least one real position of the polishing component at predetermined time points during the CMP process by the optical acceptor and the processing unit;

inspecting whether an abnormal event occurs based on the analyzed real position of the polishing component and the expected positions by the processing unit during the CMP process; and determining whether to send an alarm and stop the CMP process based on the inspecting result.

2. The method of claim 1, wherein learning at least two positions of the polishing component further comprises:
acquiring a plurality of images of the CMP apparatus at each predetermined time points by the optical acceptor during a normal swing motion of the polish component; and recognizing at least two positions of the polishing component from the images of the CMP apparatus by the processing unit.

3. The method of claim 2, wherein acquiring images of the CMP apparatus is performed continuously when recognizing at least two positions of the polish component.

4. The method of claim 1, wherein analyzing the positions of the polish component at predetermined time points further comprising:
acquiring an image of the CMP apparatus at one of the predetermined time points by the optical acceptor during the CMP process; and recognizing a real position of the polish component from the image of the CMP apparatus acquired at the predetermined time point by the processing unit.

5. The method of claim 4, wherein acquiring the image of the CMP apparatus is performed continuously when recognizing the real position of the polish component.

6. The method of claim 1, wherein inspecting whether an abnormal event occurs further comprises:
comparing one of the analyzed positions of the polish component with one of the expected positions of the polish component learned.

7. The method of claim 1, wherein inspecting whether an abnormal event occurs further comprises:
comparing two analyzed positions of the polish component.

8. The method of claim 1, wherein inspecting whether an abnormal event occurs further comprises:
comparing one of the analyzed positions of the polish component with two of the learned expected positions of the polish component corresponding to an initial position and a final position of the swing motion.

9. A method of monitoring a chemical mechanical polishing (CMP) apparatus, wherein the CMP apparatus comprises an arm configured to swing a polishing component, the method comprising:
performing a CMP process;
learning a plurality of positions of the polishing component during a normal swing motion of the polish component by an optical acceptor and a processing unit to determine an expected velocity of the normal swing motion of the polish component;
analyzing a real velocity of the swing motion of the polishing component by the optical acceptor and the processing unit during the CMP process;
inspecting whether an abnormal event occurs based on the analyzed real velocity and the expected velocity of the swing motion of the polishing component by the processing unit during the CMP process; and
determining whether to send an alarm and stop the CMP process based on the inspecting result.

10. The method of claim 9, wherein the polishing component corresponding to one of a wafer carrier, a slurry supply, a conditioning disk, or the combination thereof.

11. The method of claim 10, wherein positions of each of the wafer carrier, the slurry supply, and the conditioning disk at a predetermined time point during the normal swing motion are determined simultaneously by the optical acceptor and the processing unit.

12. The method of claim 9, further comprising:
storing data of the positions and the velocities of the polish component in a database for statistical analysis.

13. The method of claim 12, further comprising:
determining a threshold of the velocity of the swing motion of the polish component based on the stored data.

14. The method of claim 13, wherein inspecting whether an abnormal event occurs further comprises:
inspecting whether a deviation between the real velocity and the expected velocity of the swing motion of the polishing component exceeds the threshold.

15. A method, comprising:
performing a CMP process using a CMP apparatus;
swinging an arm of the CMP apparatus that is connected to a component of the CMP apparatus during the CMP process;
acquiring a plurality of images of the component of the CMP apparatus while swinging the arm of the CMP apparatus;
determining a plurality of real positions of the component of the CMP apparatus respectively based on the acquired images of the component of the CMP apparatus;
comparing the real positions of the component of the CMP apparatus with a plurality of expected positions, respectively;
determining whether an abnormal event occurs based on the comparing the real positions of the component of the CMP apparatus with the expected positions; and
stopping the CMP process when the abnormal event occurs.

16. The method of claim 15, further comprising:
putting the arm of the CMP apparatus in a normal swing motion;
determining a plurality of positions of the component of the CMP apparatus during the normal swing motion; and
determining the expected positions respectively based on the determined positions of the component of the CMP apparatus during the normal swing motion.

17. The method of claim 16, further comprising:
acquiring a plurality of images of the component of the CMP apparatus during the normal swing motion, wherein the positions of the component of the CMP apparatus during the normal swing motion are determined respectively based on the images of the component of the CMP apparatus acquired during the normal swing motion.

18. The method of claim 16, wherein the positions of the component of the CMP apparatus during the normal swing motion is determined through pattern recognition.

19. The method of claim 15, wherein comparing the real positions of the component of the CMP apparatus with the expected positions comprises:
determining deviations between the real positions and the expected positions, wherein stopping the CMP process is performed when at least one of the deviations between the real positions and the expected positions exceeds a threshold.

20. The method of claim 15, wherein acquiring the images of the component of the CMP apparatus while swinging the arm of the CMP apparatus is performed by an optical acceptor above the component of the CMP apparatus.

\* \* \* \* \*